United States Patent
Yang

(10) Patent No.: US 10,593,551 B2
(45) Date of Patent: Mar. 17, 2020

(54) METHOD TO INCREASE THE PROCESS WINDOW IN DOUBLE PATTERNING PROCESS

(71) Applicants: Semiconductor Manufacturing International (Beijing) Corporation, Beijing (CN); Semiconductor Manufacturing International (Shanghai) Corporation, Shanghai (CN)

(72) Inventor: Qing Yang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 16/214,465

(22) Filed: Dec. 10, 2018

(65) Prior Publication Data

US 2019/0181006 A1 Jun. 13, 2019

(30) Foreign Application Priority Data

Dec. 12, 2017 (CN) .......................... 2017 1 1317600

(51) Int. Cl.
*H01L 21/033* (2006.01)
*H01L 21/027* (2006.01)

(52) U.S. Cl.
CPC ...... *H01L 21/0337* (2013.01); *H01L 21/0274* (2013.01)

(58) Field of Classification Search
None
See application file for complete search history.

(56) References Cited

U.S. PATENT DOCUMENTS

| | | | |
|---|---|---|---|
| 8,808,557 B1 * | 8/2014 | Seino | G03F 7/0002 216/41 |
| 2007/0232077 A1 * | 10/2007 | Setta | G03F 7/40 438/761 |
| 2009/0061362 A1 * | 3/2009 | Taoka | G03F 7/70283 430/319 |
| 2013/0177841 A1 * | 7/2013 | Sakai | G03F 1/38 430/5 |
| 2017/0123327 A1 * | 5/2017 | Jang | G03F 1/72 |
| 2017/0168384 A1 * | 6/2017 | Shishido | G03F 1/32 |

* cited by examiner

*Primary Examiner* — Shamim Ahmed
(74) *Attorney, Agent, or Firm* — Kilpatrick Townsend & Stockton LLP

(57) ABSTRACT

A method for manufacturing a reticle for double patterning includes providing a first reticle for a first patterning and a second reticle for a second patterning according to a target pattern, the first reticle having a first mask pattern, and the second reticle having a second mask pattern, the first patterning being performed before the second patterning, and forming a sub-resolution assist feature (SRAF) pattern at a gap of the first mask pattern of the first reticle. The SRAF pattern is covered by the second mask pattern of the second reticle and has a size sufficient large to enable a transfer of the SRAF pattern to a material to be patterned in the first patterning.

11 Claims, 8 Drawing Sheets

METHOD TO INCREASE THE PROCESS WINDOW IN DOUBLE PATTERNING PROCESS

CROSS-REFERENCES TO RELATED APPLICATIONS

The present application claims priority to Chinese patent application No. 201711317600.0, filed with the State Intellectual Property Office of People's Republic of China on Dec. 12, 2017, the content of which is incorporated herein by reference in its entirety for all purposes.

FIELD OF THE INVENTION

The present invention relates to photolithographic processes. In particular, embodiments of the present invention relate to a method for manufacturing a reticle used for double patterning a material and a method for double patterning a material using the reticle.

BACKGROUND OF THE INVENTION

With the increase in integration degree of semiconductor devices, patterns required in semiconductor devices shrink in size with each generation of integration. A fundamental trend in the field of integrated circuits is the ever-decreasing reduction of critical feature sizes. Smaller feature sizes enable the increase in density of active devices for a given chip area, resulting in greater functionality and lower manufacturing cost. Smaller feature sizes also improve device performance. A critical dimension (CD) for a photolithography process defines a minimum line width, or a contact hole, or the smallest space between two lines or two holes of a masking material that may be patterned by the process. Double patterning processes can provide smaller pitches than single patterning processes.

FIG. 1A shows a layout diagram of a reticle in a double patterning process. A target pattern can be obtained in a material by etching (patterning) the material twice using a reticle 101 and a reticle 102. However, a problem with the double patterning process is that the process window of the pattern formed by the patterning is small, i.e., fault tolerance of the pattern is relatively small, which causes a relative large deviation between the patterned pattern and the expected pattern. For example, the portion of the pattern indicated by a circle may be broken (open), causing the patterned pattern to deviate from the target pattern.

There are two conventional techniques to increase the patterning process window. FIG. 1B shows a technique that increases the area size of a portion of the reticle 101 that may deviate from the target pattern. However, this technique would cause the reticle 101 to extend into the space of the reticle 102, and the resulting patterned pattern would still not conform to the target pattern.

FIG. 1C shows another technique that utilizes a sub-resolution assist feature (SRAF) pattern 103 that is disposed next to the main pattern of the reticle 101, which may deviate from the target pattern. In this technique, the SRAF pattern 103 is provided on the reticle 101, and its size is strictly limited. After the lithography process, the SRAF pattern 103 is not transferred to the material to be patterned. This approach only provides a limited increase in the lithographic process window.

BRIEF SUMMARY OF THE INVENTION

Embodiments of the present inventions provide novel techniques to solve the above-described problems.

According to one aspect of the present disclosure, a method for manufacturing a reticle that can be used for double patterning a material may include providing a first reticle for a first patterning and a second reticle for a second patterning according to a target pattern, the first reticle comprising a first mask pattern, and the second reticle comprising a second mask pattern, the first patterning being performed before the second patterning. The method may further include forming a sub-resolution assist feature (SRAF) pattern at a gap of the first mask pattern of the first reticle, the SRAF pattern is covered by the second mask pattern of the second reticle and has a size sufficient large to enable a transfer of the SRAF pattern to a material to be patterned in the first patterning.

In one embodiment, the SRAF pattern has a size that is equal to a size of the second mask pattern.

In one embodiment, the SRAF pattern includes a plurality of SRAF elements.

In one embodiment, the SRAF pattern may include a rectangular shaped portion or an L-shaped portion.

According to another aspect of the present disclosure, a method for double patterning a material is provided. The method may include performing a first patterning on a material layer using a first reticle, the first reticle having a first mask pattern and a sub-resolution assist feature (SRAF) pattern disposed at a gap of the first mask pattern, the SRAF pattern having a size sufficiently large to enable a transfer of the SRAF pattern to the material layer in the first patterning. The method may also include, after performing the first patterning on the material layer, performing a second patterning on the material layer using a second reticle, the second reticle having a second mask pattern covering the SRAF pattern.

In one embodiment, performing the first patterning may include forming a first photoresist layer on the material layer, performing a first lithography process on the first photoresist layer using the first reticle to transfer the first mask pattern and the SRAF pattern to the first photoresist layer, and after performing the first patterning, etching the material layer using the first photoresist layer as a mask to transfer the first mask pattern and the SRAF pattern to the material layer, and removing the first photoresist layer.

In one embodiment, performing the second patterning includes forming a second photoresist layer on the material layer, performing a second lithography process on the second photoresist layer using the second reticle to transfer the second mask pattern to the second photoresist layer, and after performing the second patterning, etching the material layer using the second photoresist layer as a mask to transfer the second mask pattern to the material layer.

In one embodiment, the SRAF pattern has a size equal to a size of the second mask pattern. In one embodiment, the SRAF pattern has a size smaller than a size of the second mask pattern.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1A:
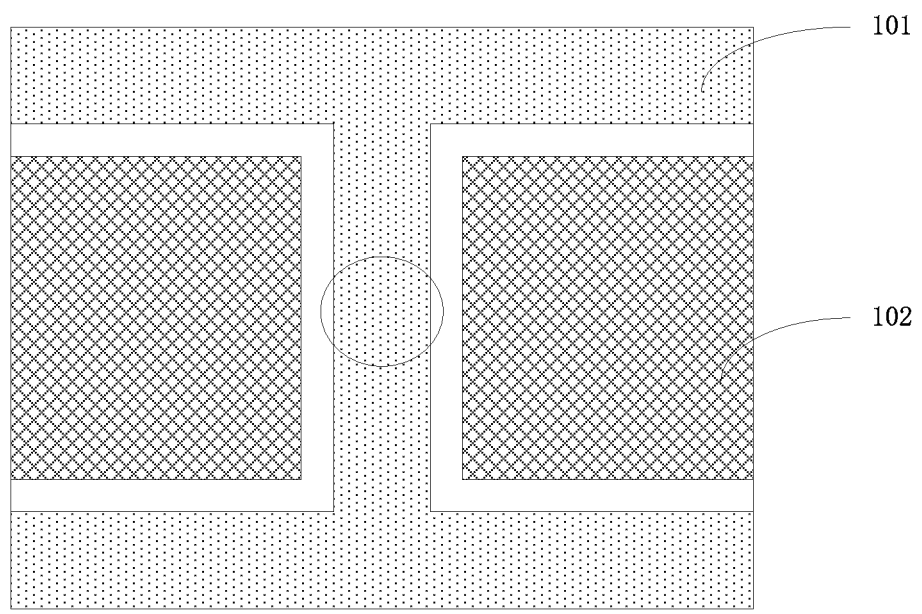
FIG. 1A shows a layout diagram of a reticle in a double patterning process that may be used for embodiments of the present invention.
Figure 1B:
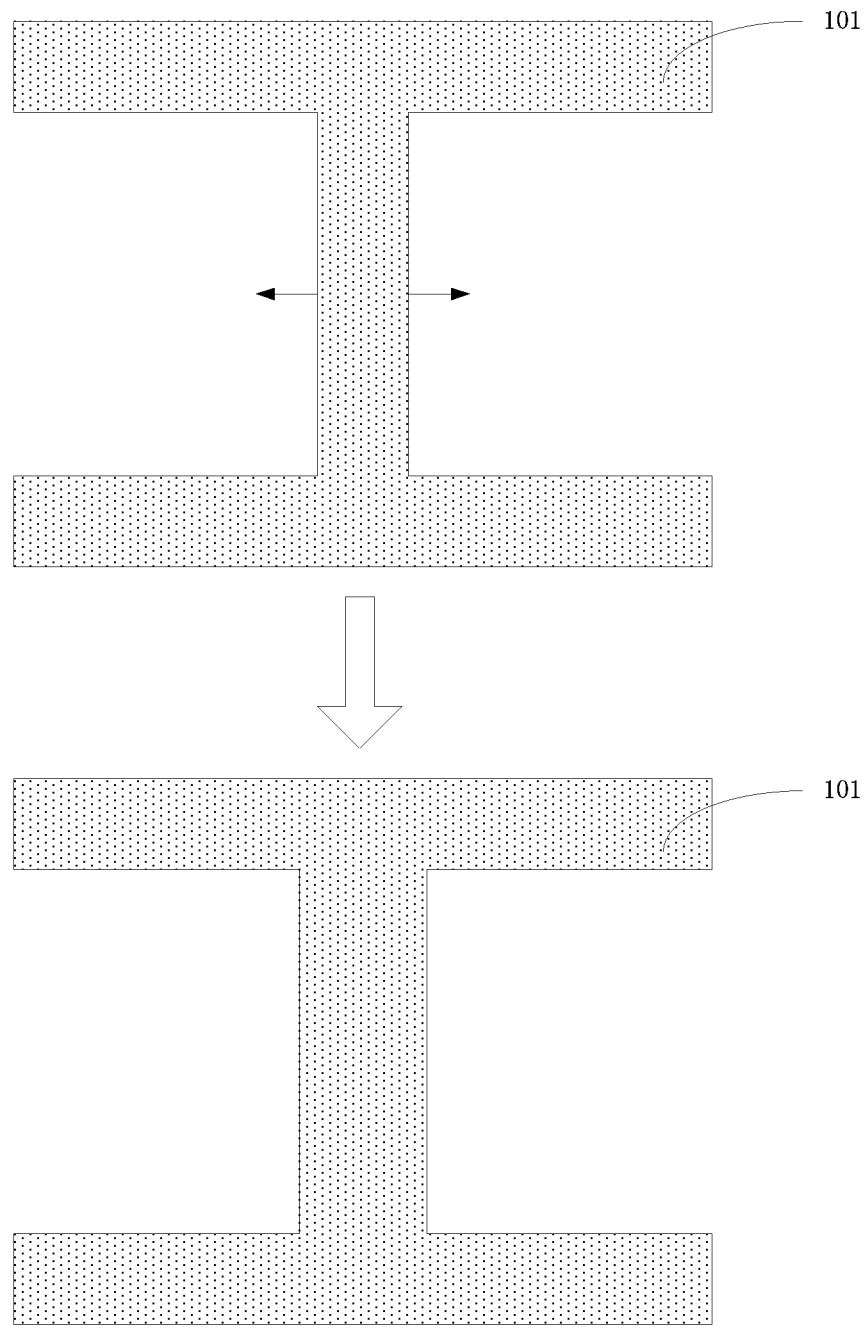
FIG. 1B shows a layout diagram of a reticle according to a conventional double patterning process.
Figure 1C:
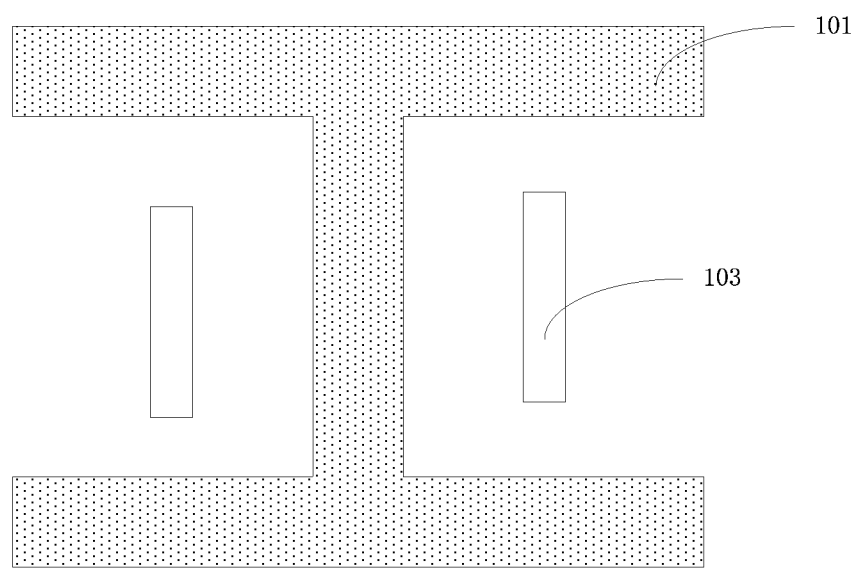
FIG. 1C shows a layout diagram of a reticle according to another conventional double patterning process.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

The invention is defined by the appended claims. This description summarizes aspects of exemplary embodiments and should not be used to limit the claims. While the invention may be embodied in various forms, there is shown in the drawings and will hereinafter be described some exemplary and non-limiting embodiments, with the understanding that the present disclosure is to be considered an exemplification of the invention and is not intended to limit the invention in the specific embodiments illustrated.

Embodiments of the present invention achieve technical advantages by providing novel methods of making optimized optical proximity correction for lithography masks used in the fabrication of material layers of a semiconductor device. This invention may, however, be embodied in many different forms and should not be construed as limited to the embodiments set forth herein.

Figure 2:
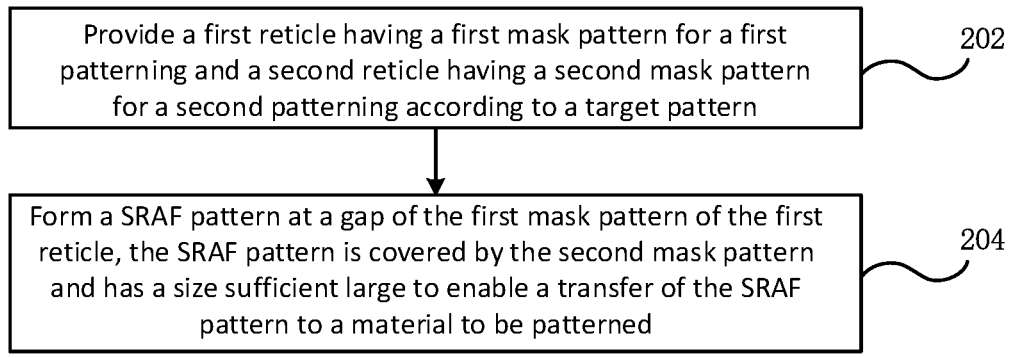
FIG. 2 is a simplified flowchart of a method for manufacturing a reticle that may be used in a double patterning process according to one embodiment of the present invention.
Figure 3A:
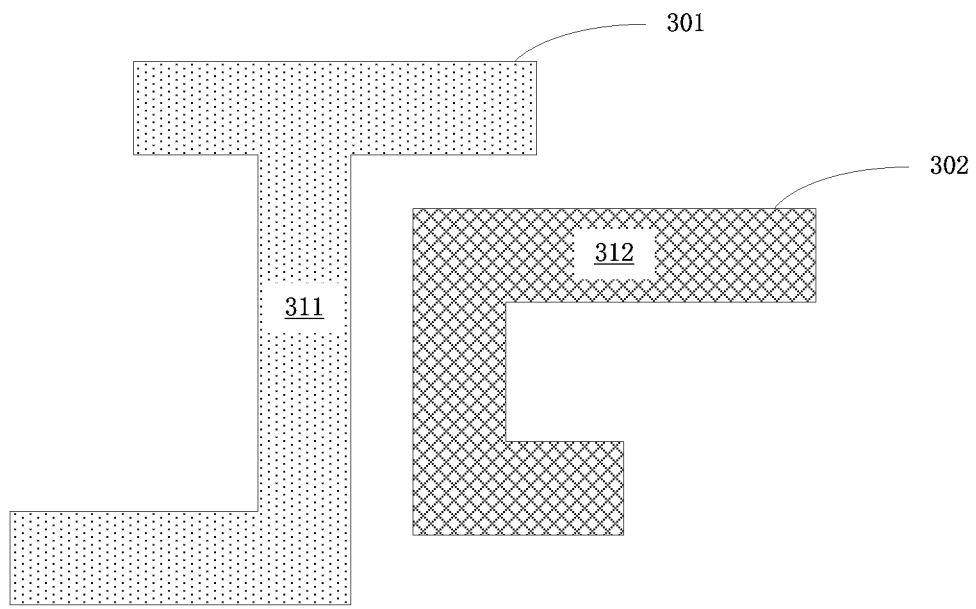
FIGS. 3A and 3B show top plan views of various stages of a method for manufacturing a reticle for double patterning according to one embodiment of the present invention.
Figure 3B:
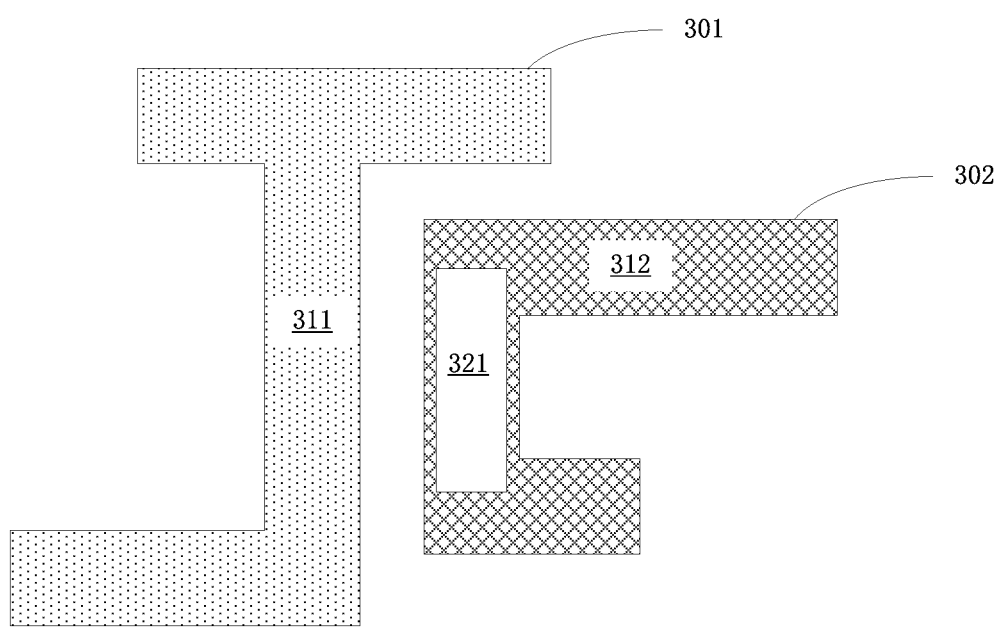

FIG. 2 is a simplified flowchart of a method for manufacturing reticles that may be used in a double patterning process of a material according to one embodiment of the present invention. FIGS. 3A and 3B are top plan views illustrating various stages of a method for manufacturing a reticle for double patterning according to one embodiment of the present invention. Embodiments of the present invention will be described in detail below with reference to FIG. 2 and FIGS. 3A and 3B.

Referring to FIG. 2 and FIG. 3A, a method for manufacturing reticles used in a double patterning process of a material may include, at step 202, providing a first reticle 301 for a first patterning and providing a second reticle 302 for a second patterning according to a target pattern. In the embodiment, the first patterning is performed before the second patterning.

For example, the relative positional relationship, the gap or spacing between the first reticle 301 and the second reticle 302 may be determined according to the target pattern. As used herein, the term "gap" or "spacing" is referred to as an area (space) where no pattern of the first mask pattern of the first reticle is present, i.e., the gap is free of any first mask pattern.

Referring to FIG. 3A, the first reticle 301 has a first mask pattern 311, and the second reticle 302 has a second mask pattern 312. In the first patterning and the second patterning, the first mask pattern 311 and the second mask pattern 312 are respectively transferred into the material to be patterned to form the target pattern.

At step 204, the method further includes forming an SRAF pattern 321 in a gap or spacing of the first mask pattern 311 of the first reticle 301, as shown in FIG. 3B.

Herein, the size of the SRAF 321 is configured such that the SRAF pattern 321 can be transferred to the material to be patterned in the first patterning, and the SRAF pattern 321 is set to be covered by the second mask pattern 312. In one embodiment, a size of the SRAF pattern 321 and a size of the second mask pattern 312 may be the same. In an exemplary embodiment, the width of the SRAF 321 may be made the same as the width of a portion of the second mask pattern 312 that covers the SRAF 321. In another exemplary embodiment, the length of the SRAF 321 may be made the same as the length of a portion of the second mask pattern 312 that covers the SRAF 321. In one embodiment, the SRAF pattern 321 may include a plurality of SRAF elements, and the plurality of SRAF elements are covered by the second mask pattern 312. In one embodiment, the plurality of SRAF elements may include multiple short horizontal (rectangular shaped) bars spaced apart from each. In another embodiment, the plurality of SRAF elements may include multiple short vertical bars spaced apart from each. In yet another embodiment, the plurality of SRAF elements may include multiple L-shaped polygons spaced apart from each.

That is, after the first patterning, the SRAF pattern 321 may be transferred into the material to be patterned (etched). And after the second patterning, the second mask pattern 321, which is transferred into the material to be etched, may cover the SRAF pattern 321, so that the SRAF pattern 321 in the material layer may disappear (may not be seen).

In this way, under the condition that the SRAF patter 321 is covered by the second mask pattern 312, the size of the SRAF pattern 321 can be adjusted so that the SRAF pattern 321 can be transferred to the to-be-etched (the terms "to-be-etched" and "to-be patterned" are alternately used in this disclosure) material in the first patterning. Because the SRAF 321 is covered by the second mask pattern 312, the to-be-etched material, the resulting pattern in the material layer does not have the SRAF pattern 321.

It should be noted that, although the shape of the SRAF pattern 321 is shown as a rectangle, the present invention is not limited thereto. For example, the SRAF pattern 321 may also have other suitable shapes, e.g., an L-shape that includes a first rectangle and a second rectangle connected to one end of the first rectangle, and the first rectangle and the second rectangle may be substantially perpendicular to each other.

The embodiment of the present invention can increase the size of the SRAF pattern 321 relative to conventional techniques, so that the SRAF pattern 321 can be transferred to the material in the first patterning, therefore, the amount of first-order diffracted light to the first mask pattern 311 can be increased, and the process window of the first mask pattern 311 can be increased.

Thereafter, a double patterning process may be performed using the reticle that is manufactured by the above-described method.

Figure 4:
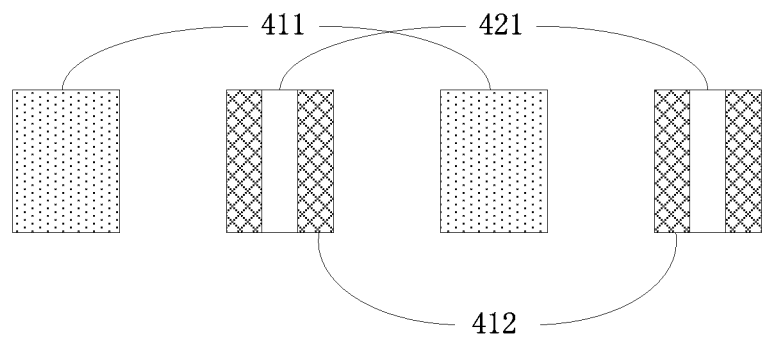
FIG. 4 is a top plan view illustration a first reticle and a second reticle according to one embodiment of the present invention.

FIG. 4 is a top plan view of a first reticle and a second reticle according to an embodiment of the present invention.

Referring to FIG. 4, the first reticle has a first mask pattern 411 and an SRAF pattern 421 (e.g., a scattering strip) disposed at a gap (spacing) of the first mask pattern 411. The gap (spacing) is the area between two first pattern 411 that is free of other patterns. The size of the SRAF pattern 421 is configured such that the SRAF pattern 421 can be transferred to a to-be-etched material layer in the first patterning. The second reticle has a second mask pattern 412, and the SRAF pattern 421 is covered by the second mask pattern 412. In one embodiment, the size of the SRAF pattern 421 is the same as the size of the second mask pattern 412. In one embodiment, the SRAF pattern 421 may include multiple SRAF patterns. In addition, the SRAF pattern 421 may be a rectangular pattern or an L-shaped pattern.

A method for double patterning (herein alternately referred to as a double patterning method) a material will be described in detail by taking the first reticle and the second reticle shown in FIG. 4 as an example.

Figure 5:
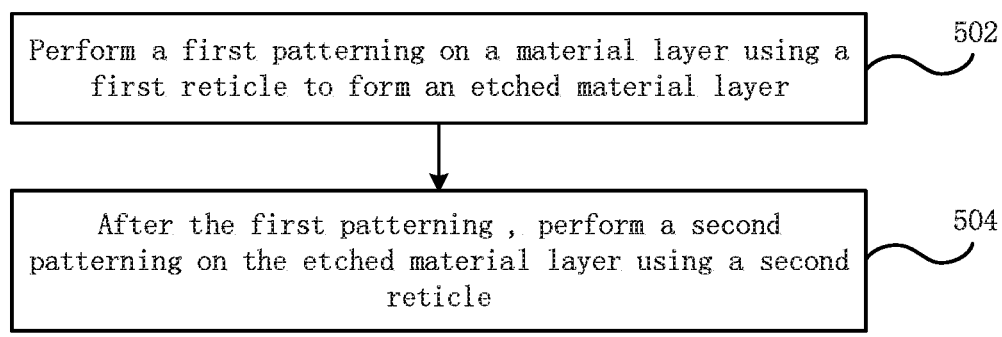
FIG. 5 is a simplified flowchart of a method for double patterning according to one embodiment of the present invention.
Figure 6A:
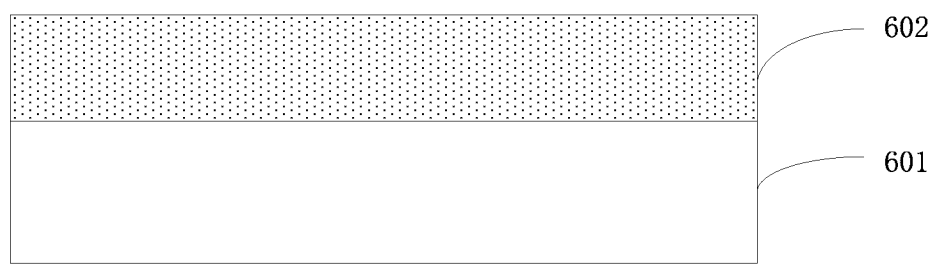
FIGS. 6A to 6C are cross-sectional views illustrating various stages of a first patterning according to one embodiment of the present invention.
Figure 6B:
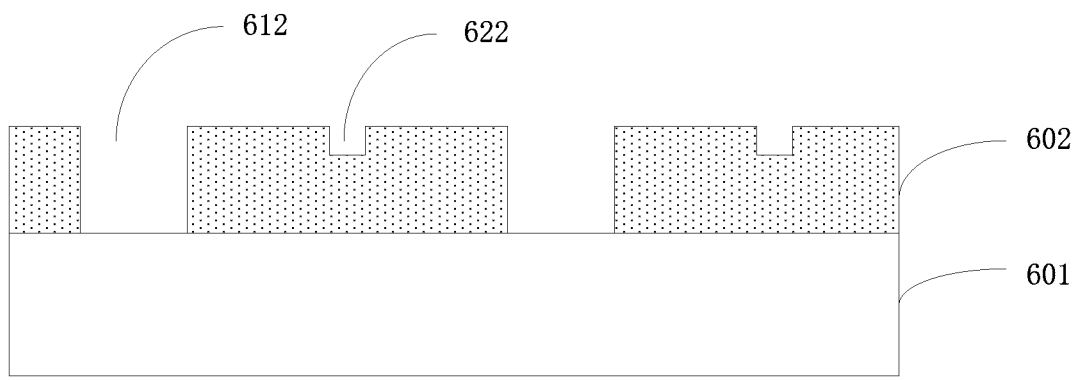
Figure 6C:
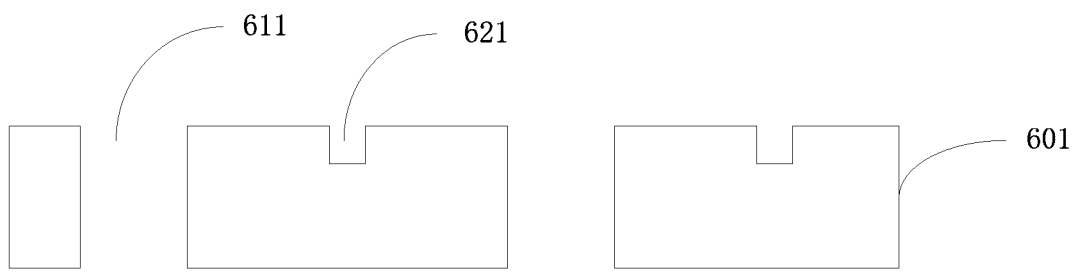

FIG. 5 is a simplified flowchart of a double patterning method according to an embodiment of the present invention. FIGS. 6A to 6C are cross-sectional views illustrating various stages of a first patterning according to one embodiment of the present invention. The double patterning method will be described in detail below with reference to FIG. 5 and FIGS. 6A to 6C.

Referring to FIG. 5, the method may include performing a first patterning on a material (the term "material" and "material layer" are used alternately herein) that is to be patterned (etched) using a first reticle, which includes a first mask pattern 411 and an SRAF pattern 421 as shown in FIG. 4.

Referring to FIG. 6A, a first photoresist layer 602 is formed on the to be etched material layer 601.

Herein, the material layer 601 may be any material layer that is to be patterned, e.g., a gate material layer, a semiconductor material layer, and the like. The material layer 601 may include a stack of a plurality of material layers. For example, the material layer 601 may include a semiconductor substrate and a hardmask layer on the semiconductor substrate.

The first photoresist layer 602 may be a positive photoresist or a negative photoresist. The following description uses a negative photoresist as an example.

Referring to FIG. 6B, the method includes performing a lithography process on the first photoresist layer 602 using the first reticle to transfer the first mask pattern 411 and the SRAF pattern 421 shown in FIG. 4 to the first photoresist layer 602. The lithography process is well-known in the art and is not described herein for the sake of brevity. Herein, the first photoresist layer 602 is shown to have an opening 612 (corresponding to the first mask pattern 411) extending through the first photoresist layer 602 and an opening 622 (corresponding to the SRAF pattern 421) extending into the first photoresist layer 602.

Referring to FIG. 6C, after the first patterning has been performed, the material layer 601 is etched using the first photoresist layer 602 as a mask to transfer the first mask pattern 411 and the SRAF pattern 421 to the material layer 601. The first photoresist layer 602 is then removed. Herein, the to-be-etched material layer 601 is shown to have an opening 611 (corresponding to the first mask pattern 411) extending through the material layer 601 and an opening 621 (corresponding to the SRAF pattern 421) extending into the material layer 601.

Referring back to FIG. 5, at step 504, the method may further include performing a second patterning on the material layer 601 using a second reticle.

Figure 6D:
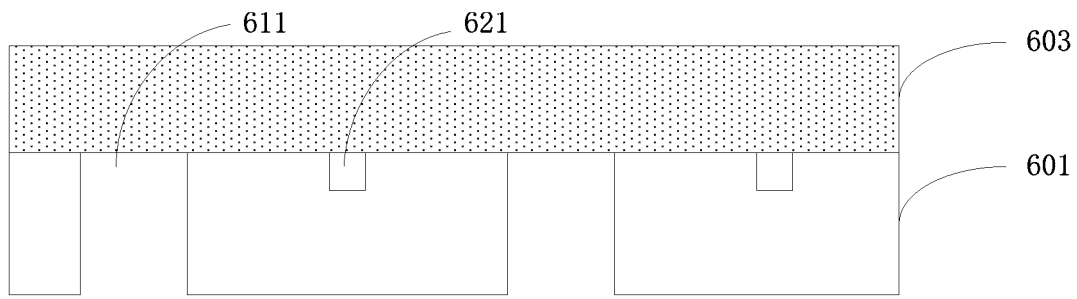
FIGS. 6D to 6F are cross-sectional views illustrating various stages of a second patterning according to one embodiment of the present invention.
Figure 6E:
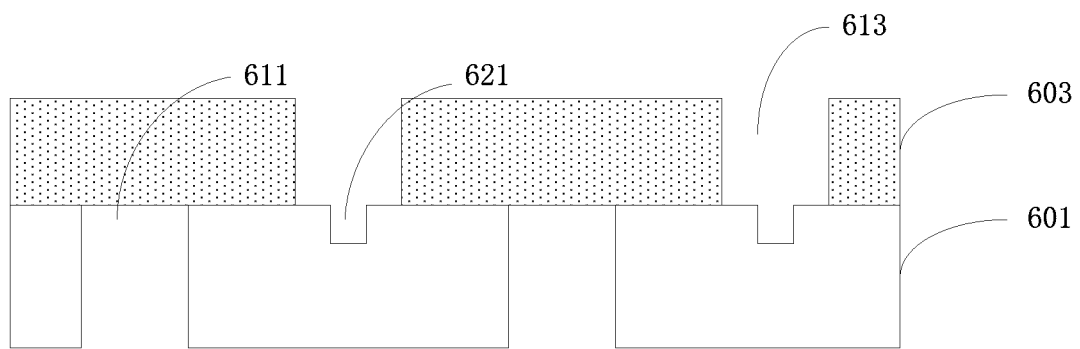
Figure 6F:
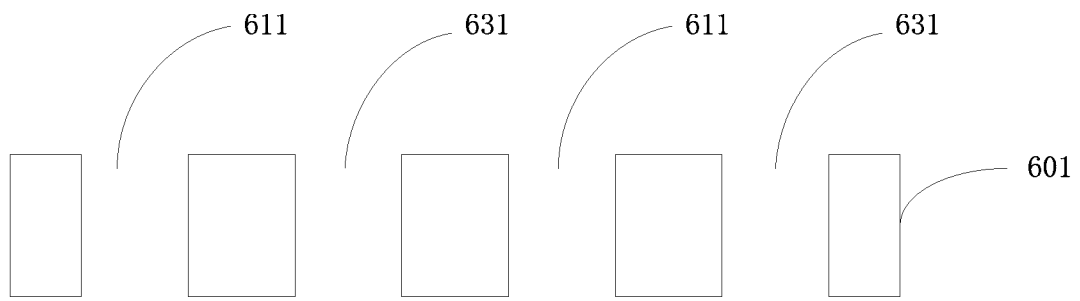

FIGS. 6D to 6F are cross-sectional views illustrating various stages of a second patterning according to one embodiment of the present invention.

Referring to FIG. 6D, a second photoresist layer 603 is formed on the etched material layer 601 shown in FIG. 6C.

Referring to FIG. 6E, the method includes performing a photolithography process on the second photoresist layer 603 using the second reticle to transfer the second mask pattern 412 shown in FIG. 4 to the second photoresist layer 603. Herein, the second photoresist layer 603 is shown to have an opening 613 (corresponding to the second mask pattern 412) extending through the second photoresist layer 603.

Referring to FIG. 6F, after the second patterning has been performed, the material layer 601 is patterned (etched) using the second photoresist layer 602 as a mask to transfer the second mask pattern 412 to the material layer 601. The second photoresist layer 602 is then removed. Herein, the etched material layer 601 is shown to have an opening 631 (corresponding to the second mask pattern 412) extending through the material layer 601. Since the second mask pattern 412 covers the SRAF pattern 421, the opening 621 corresponding to the SRAF pattern 421 disappears.

Thus, the method for manufacturing a reticle for double patterning and the method for performing a double patterning have been described in detail. The steps described in connection with the present disclosure may be embodied directly in hardware, in a software module executed by a processor, or in a combination of the two. A software module may reside in any form of storage medium that is known in the art. A software module may comprise a single instruction or may instructions and may be distributed over several different code segments, among different programs, and across multiple storage modules.

The methods disclosed herein comprise one or more steps for achieving the described method. The method steps may be interchanged with one another without departing from the scope of the claims. In other words, unless a specific order of steps is specified, the order and use of specific steps may be modified without departing from the scope of the claims.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a reticle used for double patterning a material, comprising:
providing a first reticle for a first patterning and a second reticle for a second patterning according to a target pattern, the first reticle comprising a first mask pattern, and the second reticle comprising a second mask pattern, the first patterning being performed before the second patterning;
forming a sub-resolution assist feature (SRAF) pattern at a gap of the first mask pattern of the first reticle, the SRAF pattern being covered by the second mask pattern of the second reticle and having a size sufficiently large to enable a transfer of the SRAF pattern to a material to be patterned in the first patterning.

2. The method of claim 1, wherein the SRAF pattern has a size that is equal to a size of the second mask pattern.

3. The method of claim 1, wherein the SRAF pattern comprises a plurality of SRAF elements.

4. The method of claim 1, wherein the SRAF pattern comprises a rectangular shape or an L-shape.

5. A method for double patterning a material, comprising:
performing a first patterning on a material layer using a first reticle, the first reticle having a first mask pattern and a sub-resolution assist feature (SRAF) pattern disposed at a gap of the first mask pattern, the SRAF pattern having a size sufficiently large to enable a transfer of the SRAF pattern to the material layer in the first patterning;
after the first patterning has been performed on the material layer, performing a second patterning on the material layer using a second reticle, the second reticle having a second mask pattern covering the SRAF pattern.

6. The method of claim 5, wherein performing the first patterning comprises:
forming a first photoresist layer on the material layer;
performing a first lithography process on the first photoresist layer using the first reticle to transfer the first mask pattern and the SRAF pattern to the first photoresist layer;
after the first patterning, etching the material layer using the first photoresist layer as a mask to transfer the first mask pattern and the SRAF pattern to the material layer;
removing the first photoresist layer.

7. The method of claim 6, wherein the second patterning comprises:
forming a second photoresist layer on the material layer;
performing a second lithography process on the second photoresist layer using the second reticle to transfer the second mask pattern to the second photoresist layer;
after the second patterning, etching the material layer using the second photoresist layer as a mask to transfer the second mask pattern to the material layer.

8. The method of claim 5, wherein the SRAF pattern has a size equal to a size of the second mask pattern.

9. The method of claim 5, wherein the SRAF pattern has a size smaller than a size of the second mask pattern.

10. The method of claim 5, wherein the SRAF pattern comprises a plurality of SRAF elements.

11. The method of claim 5, wherein the SRAF pattern comprises a rectangular shape or an L-shape.

* * * * *